(12) United States Patent
Borjon

(10) Patent No.: US 8,230,371 B2
(45) Date of Patent: Jul. 24, 2012

(54) PROCESS-WINDOW AWARE DETECTION AND CORRECTION OF LITHOGRAPHIC PRINTING ISSUES AT MASK LEVEL

(75) Inventor: Amandine Borjon, Viriat (FR)

(73) Assignee: NXP B.V., Eindhoven (NL)

( * ) Notice: Subject to any disclaimer, the term of this patent is extended or adjusted under 35 U.S.C. 154(b) by 242 days.

(21) Appl. No.: 12/597,997

(22) PCT Filed: May 9, 2008

(86) PCT No.: PCT/IB2008/051863
§ 371 (c)(1),
(2), (4) Date: May 10, 2010

(87) PCT Pub. No.: WO2008/142604
PCT Pub. Date: Nov. 27, 2008

(65) Prior Publication Data
US 2010/0293413 A1 Nov. 18, 2010

(30) Foreign Application Priority Data
May 25, 2007 (EP) ...................................... 07290703

(51) Int. Cl.
G06F 17/50 (2006.01)
(52) U.S. Cl. ............................................ 716/55; 716/54
(58) Field of Classification Search ................ 716/52–56
See application file for complete search history.

(56) References Cited

U.S. PATENT DOCUMENTS

| 7,418,683 | B1 * | 8/2008 | Sonnard et al. ................ 716/122 |
| 2003/0115569 | A1 | 6/2003 | Ikeuchi |
| 2004/0158808 | A1 | 8/2004 | Hansen |
| 2005/0251771 | A1 | 11/2005 | Robles |
| 2006/0236294 | A1 | 10/2006 | Saidin et al. |
| 2008/0072207 | A1 * | 3/2008 | Verma et al. .................... 716/21 |

FOREIGN PATENT DOCUMENTS

| WO | 9914638 A1 | 3/1999 |
| WO | 2005081910 A2 | 9/2005 |

OTHER PUBLICATIONS

Belledent, J., et al; "Critical Failure ORC—Application to the 90-nm and 65-nm Nodes"; Optical Microlithography XVII; Ed. Bruce W. Smith; Proceedings of SPIE vol. 5377; SPIE Bellingham, WA, US) 2004; pp. 1184-1197.
Borjon, A., et al; "High Accuracy 65nm OPC Verification: Full Process Window Model vs. Critical Failure ORC"; Proceedings of the SPIE—The International Society for Optical Engineering SPIE—Int. Soc. Opt. Eng USA; vol. 5754, No. 1; pp. 1190-1201; XP002505935; ISSN: 0227-786X.

* cited by examiner

Primary Examiner — Nghia Doan
Assistant Examiner — Binh Tat

(57) ABSTRACT

In one aspect of the invention, a method provides a calibrated critical-failure model for a printing process of a critical feature by virtue of a classification of an optical parameter space according to at least two print-criticality levels. Print failure of a respective critical feature is judged on the basis of a print-failure criterion for the critical feature. The respective print-criticality level is ascertained from test-print-simulation data at a sampling point of a process window for a given point in an optical-parameter space, and from a failure rule. An advantage achieved with the method is that it comprises ascertaining the predefined optical-parameter set from the test-print-simulation data at only one sampling point of the process window, which sampling point is identical for all test patterns. This saves processing time and processing complexity by reducing the number of ascertained optical-parameter sets and their processing in the subsequent scanning and classifying steps.

19 Claims, 8 Drawing Sheets

PROCESS-WINDOW AWARE DETECTION AND CORRECTION OF LITHOGRAPHIC PRINTING ISSUES AT MASK LEVEL

FIELD OF THE INVENTION

The present invention relates to a method and apparatus for calibrating a critical-failure model regarding a printing failure of a critical feature in a physical layout of a print pattern. It also relates to a method and apparatus for correcting a critical feature in a physical layout of a print pattern, and to an apparatus for designing a physical layout of an integrated circuit. Finally, the invention relates to a carrier medium and to a computer program for use in the above context.

BACKGROUND OF THE INVENTION

The design of highly integrated circuits follows a path from an abstract description of the integrated circuit, for instance in a hardware description language such as VHDL, to a physical layout. The physical layout defines geometrical parameters of device elements of the integrated circuit. The device elements may be defined by polygon-based structures to be fabricated on a wafer.

The wafer fabrication comprises lithographic steps, in which the physical layout is fabricated layer by layer using a respective lithographic mask. The mask layout is printed to a photosensitive resist layer deposited temporarily on the wafer. As a part of the lithographic printing process, the resist layer is exposed through the mask and developed to expose sections of a wafer, which are to be processed by etching or material deposition. After the respective required processing, the resist is removed, and a next lithographic step can be performed.

With increasing integration densities of integrated circuits the lithographic generation of a physical layout on a wafer has become more and more challenging. One reason is the continuing reduction of lateral feature extensions in the physical layout. Another reason is a diminishing of process windows that can be used during the lithographic process. A process window is spanned by allowable values of a dose of exposure-radiation used for exposing the resist layer and by a focused position of a mask-image plane relative to the resist layer in a depth direction of the resist layer.

Generally the mask design involves a process called design rule check (DRC), in which the physical layout is verified and corrected, if necessary. Only after proper DRC processing, the physical layout is used for fabricating the masks for different layers of the integrated circuit, which are going to be used during wafer fabrication. To cope with the increased challenges of high integration densities, the mask design process has been extended by techniques such as Optical Proximity Correction (OPC), Mask Rule Checking (MRC) and Optical Rule Checking (ORC). During the OPC flow, the mask design is changed using a physical model to assess process printing characteristics. The physical model is composed of an optical model and a resist model. The optical model takes account of the physical effects influencing the formation of an aerial image of the mask. The resist model takes account of the characteristics of the resist layer in the formation of the real image of the mask during the exposure and in the development after exposure. These two components of the OPC model enable a rapid calculation of the intensity of an aerial image and of the resist contour during the flow of the OPC method.

To detect potential printing failures across the process window, one solution is a calibration of an optical model and of a resist model from experimental data obtained from fabricated test prints of test patterns. Subsequently, the printing contours of the test patterns in the test prints are simulated at several points of the process window and the lateral extensions of the simulated patterns are measured. However, this technique requires much computing run time.

An alternative solution is the use of a so-called critical-failure ORC (CFORC) technique. CFORC is described in the publication 1. Belledent et al., "Critical failure ORC—Application to the 90-nm and 65-nm nodes." Optical Microlithography XVII, ed. Bruce W. Smith, Proceedings of SPIE Vol. 5377 (SPIE, Bellingham, Wash., 2004), pp. 1184 to 1197. CFORC uses an empirical formula that links a simulated aerial image to a likelihood of any feature to fail within the process window requirements. The calibration is based on experimental data using the full process flow and full process window of a layer being characterized. It allows for instance capturing pinching and bridging effects on a layer of poly-silicon.

A process flow that is used to calibrate a critical-failure model in the CFORC process flow is described in this article. In a first processing step, test patterns are designed and fabricated using commonly known processes involving the fabrication of a mask and the printing of the mask pattern by lithographic steps on a wafer. The experimental results are collected from throughout the process window to also cover ranges of printing failure. A printing feature will be flagged if it fails to be well patterned at any process condition. After performing the measurements, aerial images are collected at best printing conditions using an optical model that is calibrated on data based on successful printing. In that way, the aerial image shape and failing status are gathered in a text file. The aerial image is characterized by a set of optical parameters. The optical parameters can for example be a minimum intensity, a maximum intensity, and a slope at a predefined reference threshold intensity that corresponds to the onset of printing in an intensity contour across a printing feature. A classification is then performed on the basis of pass-fail data obtained form exploring the process window in step 106 and from the optical parameters obtained. The classification serves to find a boundary between two or more different categories of the experimental of the rations, which are for examples "pass" or "fail". A failure model or classification boundary is described in the form $$\text{class}(x) = c1 * \text{kernel}(x-x1) + c2 * \text{kernel}(x-x2) + \ldots,$$

where x is a vector of input parameters, x1, x2 are observation points, and "kernel" describes a Gaussian kernel. The observation points x1, x2 . . . are the optical parameters and pass/fail observations of each feature in the test patterns. A boundary between pass and fail regions is calculated on the basis of this classification, which forms the CFORC model. The CFORC model can be used to take features in a physical layout during simulation to indicate their likelihood to fail during printing.

It would be desirable to use a method for calibrating a critical-failure model that needs less processing expenditure.

SUMMARY OF THE INVENTION

According to a first aspect of the invention, a method for calibrating a critical-failure model regarding a printing failure of a critical feature in a physical layout of a print pattern is provided, for instance a print pattern of an integrated circuit. The method comprises:

providing a print-failure criterion for the critical feature, the print-failure criterion being related to a geometrical parameter in a print of the critical feature, as derived from test-print-simulation data simulating the print;

providing test-print-simulation data representing print simulations of different test patterns, which have the critical feature, wherein the different test patterns differ between each other in their respective values of the geometrical parameter of the critical feature;

ascertaining a predefined optical-parameter set from the test-print-simulation data at the print position of the critical feature;

scanning the test-print-simulation data for the presence of print-failures according to the print-failure criterion; and classifying regions in an optical-parameter space spanned by at least one optical parameter of the optical-parameter set according to at least two print-criticality levels using the detected print failures in the test-print simulations at respective points of the optical-parameter space.

In the method of the first aspect of the invention, the predefined optical-parameter set is ascertained from the test-print-simulation data at only one sampling point of a process window, which sampling point is identical for all test patterns;

at least one failure rule is provided before the classifying of the optical-parameter space, which failure rule provides trend information for points in the optical-parameter space, the trend information being indicative of a trend of the geometrical parameter in a print of the critical feature of a test pattern when moving from said sampling point in the process window to a different process-window point; and the classifying of the optical-parameter space comprises ascertaining the respective print-criticality levels from the test-print-simulation data at the sampling point and from the failure rule.

The method of the first aspect of the invention provides a calibrated critical-failure model for a printing process of a critical feature by virtue of a classification of an optical parameter space according to at least two print-criticality levels. The critical-failure model relates to a potential printing failure of a critical feature in a physical layout of a print pattern. A critical feature is for instance formed by a thin line, which wherein criticality results from the fact that the line may be interrupted in the printing process due to pinching. Another example of a critical feature is formed by two closely spaced features such as lines, which can be subject to undesired bridging due to the printing process.

Note that the terms "print" and "printing" are used here in the lithographic context that is known applied in fabricating small structures on substrates in the field of electronics and optoelectronics.

Print failure of a respective critical feature is judged in the method of the first aspect of the invention on the basis of a print-failure criterion for the critical feature. The print-failure criterion is related to a geometrical parameter in a print of the critical feature, as derived from test-print simulation data. A print-failure criterion for instance provides threshold values of the geometrical parameter, below or above which, depending on the critical feature, print failure is defined to occur.

The critical-failure model is calibrated in that the classification of the optical-parameter space delivers one of at least two respective print-criticality levels for the points of the optical-parameter space, i.e., the n-tuples of optical parameters forming the optical-parameter set. The respective print-criticality level is ascertained not only from the test-print-simulation data at the sampling point of the process window for a given point in the optical-parameter space, but also from the failure rule. The sampling point of the process window is one point of the process window, i.e., it corresponds to one process condition used for exposing a lithographic resin. The sampling point of the process window is not to be understood as a process condition that is given and fixed for any application case. It should be selected for a respective process used on a respective printing equipment.

An advantage of the method of the first aspect of the invention is that it comprises ascertaining the predefined optical-parameter set from the test-print-simulation data at only one sampling point of a process window, which sampling point is identical for all test patterns. Whereas known critical-failure models are ascertained using test prints or test-print-simulation data at different points of the process window, this is not required for the method of the invention. Therefore, the ascertaining of the predefined optical-parameter set from the test-print-simulation data at the print position of the critical feature has to be performed for only the sampling point of the process window, and not for any further point for the process window. This saves processing time and processing complexity by reducing the number of ascertained optical-parameter sets and their processing in the subsequent scanning and classifying steps.

The method of the first aspect of the invention is at this point based on the recognition that the printing behavior across the complete process window is linked to the optical-parameter set extracted at only one condition, namely, the sampling point of the process window. The printing behavior at other points of the process window is in the method of the invention derived from a failure rule. The failure rule provides trend information indicative of a trend of the geometrical parameter according to the print-failure criterion in a print of the critical feature of a test pattern when moving from the sampling point in the process window to a different point in the process window. Trend information relates to the behavior of the geometrical parameter when moving away from the sampling point of the process window. The behavior can for instance be an increase or decrease of the value of the geometrical parameter, or the behavior can be characterized by the geometrical parameter remaining constant when moving away from the sampling point to a different process-window point.

Given the print behavior at the sampling point and the trend information, any point of the optical-parameter space can be classified according to the method of the invention by one of the at least two point-criticality levels. In the case of exactly two print-criticality levels, these correspond to "pass" and "fail". However, a more differentiated classification are also within the scope of the method of the invention, as will be described in the context of embodiments further below.

In the following, embodiments of the method of the invention will be described. The embodiments can be combined with each other unless explicitly described as forming alternatives to each other.

The initial steps of providing a print-failure criterion and providing test-print-simulation data can each performed in different ways. In different embodiments, providing is performed in the form of generating the print-failure criterion, receiving the print-failure criterion from an external unit, for instance a user interface or a storage. The same holds for the test-print simulation data. These can be generated as a part of the flow of the method in one embodiment. In another embodiment the test-print-simulation data are delivered by an external unit, such as an input for print simulation data or by a memory.

Test-print-simulation data are for instance provided in the form of data representing an aerial image of a mask in a resin. An aerial image can be calculated from the physical layout and from the process conditions at the sampling point for a specific printing process by methods known in the art.

The process conditions at the sampling point correspond in one embodiment to one selected point of a two-dimensional process window, which is spanned by an exposure-radiation-dose interval available for exposing a resist layer at a print position of the critical feature and by an available focus-position interval of a mask-image plain relative to the resist layer at the print position of the critical feature. Additional parameters can be used to form a more than two-dimensional, i.e., multi-dimensional process window. The sampling point of the process window can be selected as any point that describes process conditions, which can be met by the printing process, i.e., lying within the process window. Process parameters that cannot be met during the printing process are outside the process window. In one embodiment, the sampling point forms a point at or near the center of the different process-parameter intervals defining the two- or multi-dimensional process window.

Some embodiments are more elaborate in the classification of the optical-parameter space. In one embodiment, classifying the optical-parameter space comprises, after scanning the test-print-simulation data for the presence of print-failures, ascertaining a criticality-indicator value, which is indicative of a respective degree of criticality of a print of the critical feature according to the print-failure criterion. The criticality-indicator value of this embodiment depends on a detected presence or absence of a print-failure at the sampling point of the process window and on the trend of the geometrical parameter of the test pattern predicted by the failure rule when moving to at least one different process window point. The use of a numerical criticality indicator allows a differentiating between a selectable, in principle arbitrary number of levels of criticality and provides a definition of a threshold of criticality regarding print failure that is easy to handle. Consequently, classifying the optical-parameter space preferably includes differentiating regions in the optical-parameter space according to different criticality indicator values.

In one particular embodiment, the trend information provided by the failure rule is indicative of a change amount and change direction of the geometrical parameter in a print of the critical feature of a test pattern when moving from the sampling point in the process window to a different process-window point. In this embodiment, the trend information is particularly precise and allows direct application of the print-failure criterion to derive a criticality level at any point of the process window with high precision.

This can for instance take the form that the classification of the optical-parameter space comprises ascertaining, from the test-print-simulation data at the sampling point and from the failure rule, for a given point in the optical-parameter space, a respective point in the process window, at which the respective criticality-indicator value exceeds a predetermined threshold. Criticality can thus be determined with a view to likely process variations. A particular set of optical parameters derived from a test-print pattern, can thus be characterized as stabile or unstable against process variation with high precision.

In a further embodiment, classifying the optical-parameter space comprises ascertaining, for a respective point in the optical-parameter space, a distance between the sampling point of the process window and a nearest process-window point, at which the respective criticality-indicator value exceeds a predetermined threshold. The distance between the sampling point of the process window and a respective nearest process window point, at which the respective criticality indicator exceeds a predetermined threshold provides a particularly suitable metric for characterizing the criticality or stability of a critical feature throughout the process window.

In this embodiment, the criticality-indicator value can be derived in proportion to the distance between the sampling point and the nearest process-window point giving rise to criticality above threshold. Several optical parameters are suitable for use in the method of the invention.

Preferably, two or three optical parameters are used as an optical-parameter set forming the optical-parameter space for the critical-failure model. Generally, in some embodiments the optical-parameter set comprises at least one optical parameter from the group formed by a) a maximum intensity of an aerial image of the test pattern at the print position of the feature,
b) a minimum intensity of an aerial image of the test pattern at the print position of the feature,
c) a slope of an intensity profile of an aerial image of the test pattern at the print position of the feature at a predefined threshold position between the positions of the minimum intensity and of the maximum intensity in the aerial image of the test pattern, and
d) a curvature of an intensity profile of an aerial image of the test pattern at the print position of the feature, and
e) a composite optical parameter formed by a algebraic combination at least two of the optical parameters a) through d).

According to a second aspect of the invention, a method for correcting a critical feature in a physical layout of a print pattern, for instance an integrated circuit, is provided. The method comprises calibrating a critical-failure model regarding a printing failure of a critical feature according to the method of the first aspect of the invention or one of its embodiments described herein;

providing physical-layout data representing the physical layout of the print pattern;

detecting, using the physical-layout data, an occurrence position of the critical feature in the physical layout;

performing a print simulation of the physical layout at the occurrence position of the critical feature;

extracting at least one optical parameter of the critical feature, which optical parameter corresponds to the optical-parameter set used in the critical-failure model, from the print simulation at the occurrence position of the critical feature;

ascertaining a print-criticality level of the critical feature at the occurrence position from to the critical-failure model;

changing a geometrical parameter of the critical feature in the physical layout at the occurrence position if the critical feature has an ascertained print-criticality level above a predefined threshold value.

The method of the second aspect of the invention uses a calibrated critical-failure model according to the method of the first aspect of the invention or one of its embodiments in the context of the correction of a critical feature in a physical layout of a print pattern, in particular, an integrated circuit, for instance in a CMOS technology of the 90 nm node or an even smaller structure length. The method shares the advantages of the method for calibrating the critical-failure model and thus requires much less calculation effort and expenditure to obtain the critical-failure model, which forms the basis for correcting a physical layout to ensure correct printing throughout a process window.

The method is preferably performed in the context of an optical proximity correction flow. It can be performed in the context of an optical-rule-checking (ORC) method. The method is applicable on any design level.

According to a third aspect of the invention, a method for designing a physical layout of an integrated circuit is provided. The method comprises performing a method for calibrating a critical-failure model regarding a printing failure of a critical feature in a physical layout of a print pattern according to the first aspect of the invention or one of its embodiments.

Preferably, the method comprises performing a method for correcting a critical feature in a physical layout of an integrated circuit according to the second aspect of the invention, or one of its embodiments.

According to a fourth aspect of the invention, an apparatus for calibrating a critical-failure model regarding a printing failure of a critical feature in a physical layout of a print pattern, in particular, an integrated circuit, is provided. The apparatus comprises

- a test-print-evaluation unit that has an input for receiving test-print-simulation data representing print simulations of different test patterns calculated for only one sampling point of a process window, which sampling point is identical for all test patterns having the critical feature, and the test-print evaluation unit being configured to ascertain a predefined optical-parameter set from the test-print-simulation data at a print position of the critical feature and to provide at its output the ascertained set of optical parameters;
- a print-failure detection unit that is configured to scan the test-print-simulation data for the presence of print-failures according to a print-failure criterion, the print-failure criterion being related to a geometrical parameter of the critical feature in a print of the critical feature, as derived from the test-print simulation data;
- a model-calibration unit, which is configured to classify regions in an optical-parameter space spanned by at least one optical parameter of the optical-parameter set according to at least two print-criticality levels and to provide at its output a print model comprising allocations of respective criticality levels of respective points in the optical-parameter space.

In the apparatus of the fourth aspect of the invention, the model-calibration unit comprises a failure-rule unit, which is configured to apply a failure rule providing trend information for a given point in the optical-parameter space, the trend information being indicative of a trend of the geometrical parameter in a print of the critical feature of a test pattern when moving from said sampling point in the process window to a different process-window point, to a given point in the optical-parameter space and to provide the trend information at its output. Furthermore, the model-calibration unit is configured to ascertain the respective print-criticality levels from the test-print-simulation data at respective points of the optical-parameter space, at the sampling point and at least one different process-window point using the failure rule.

The apparatus of the fourth aspect of the invention serves for performing the method of the first aspect of the invention. It therefore allows a time-saving calibration of a critical-failure model regarding a printing failure of a critical feature.

In the following, embodiments of the calibration apparatus of the fourth aspect of the invention will be described.

Preferably the apparatus of the fourth aspect of the invention comprises a test-print simulator unit, which is configured

- to calculate test-print-simulation data representing print simulations of different test patterns, which have the critical feature, wherein the different test patterns differ between each other in their respective values of a geometrical parameter of the critical feature, for only one sampling point of a process window, which sampling point is identical for all test patterns; and
- to provide at its output test-print-simulation data representing the test print simulations;

In a further embodiment of the apparatus of the fourth aspect of the invention, the model-calibration unit is configured to ascertain a criticality-indicator value, which is indicative of a respective degree of criticality of a print of the critical feature according to the print-failure criterion, wherein the criticality indicator value depends on a detected presence or absence of a print-failure at the sampling point of the process window and on the trend of the geometrical parameter of the test pattern predicted by the failure rule when moving to at least one different process window point.

In another embodiment of the apparatus of the fourth aspect of the invention, the failure-rule unit is configured to provide trend information, which is indicative of a change amount and change direction of the geometrical parameter in a print of the critical feature of a test pattern when moving from said sampling point in the process window to a selectable different process-window point.

In yet another embodiment of the apparatus of the fourth aspect of the invention, the model-calibration unit is configured to ascertain, from the test-print-simulation data at the sampling point and from the failure rule, for a given point in the optical-parameter space, a point in the process window, at which the respective criticality-indicator value exceeds a predetermined threshold.

In a further embodiment of the apparatus of the fourth aspect of the invention, the model-calibration unit is configured to ascertain, for a respective point in the optical-parameter space, a distance between the sample point of the process window and a nearest process-window point, for which a print failure of the critical feature is predicted according to the failure rule.

According to a fifth aspect of the invention, an apparatus for correcting a critical feature in a physical layout of an integrated circuit comprises

- an apparatus for calibrating a critical-failure model regarding a printing failure of a critical feature in a physical layout of a print pattern calibrating a critical-failure model regarding a printing failure of a critical feature according to the fourth aspect of the invention or one of its embodiments;
- a layout input for providing physical-layout data representing the physical layout of the integrated circuit;
- a layout-scanner unit, which is configured to detect, using the physical-layout data, an occurrence position of the critical feature in the physical layout;
- a print-simulator unit, which is configured to calculate print-simulation data representing a print simulation of a region of the integrated circuit, which comprises the detected occurrence position of the critical feature, and to provide at its output print-simulation data representing the print simulation;
- an optical-parameter extraction unit, which is configured to extract at least one optical parameter of the critical feature, which optical parameter corresponds to the optical-parameter set used in the critical-failure model, from the print simulation at the occurrence position of the critical feature;
- a classification unit, which is configured to ascertain a print-criticality level of the critical feature at the occurrence position from the critical-failure model;
- a correction unit, which is configured to change a geometrical parameter of the critical feature in the physical layout at the occurrence position if the critical feature has an ascertained print-criticality level above a predefined threshold value.

According to a sixth aspect of the invention, an apparatus for designing a physical layout of an integrated circuit is provided, comprising an apparatus for calibrating a critical-failure model regarding a printing failure of a critical feature in a physical layout of a print pattern according to the fourth aspect of the invention or one of its embodiments.

According to a seventh aspect of the invention, a carrier medium is provided that carries computer-readable code for controlling a computer to carry out the method of the first, second or third aspect of the invention or one of its respective embodiments.

According to a eighth aspect of the invention a computer program is provided for controlling a computer to carry out the method of the first, second or third aspect of the invention or one of its respective embodiments.

Embodiments of the invention are also defined in the dependent claims.

BRIEF DESCRIPTION OF THE DRAWINGS

The invention will now be explained in more detail with reference to the drawings in which.

DETAILED DESCRIPTION OF EMBODIMENTS

Figure 1:
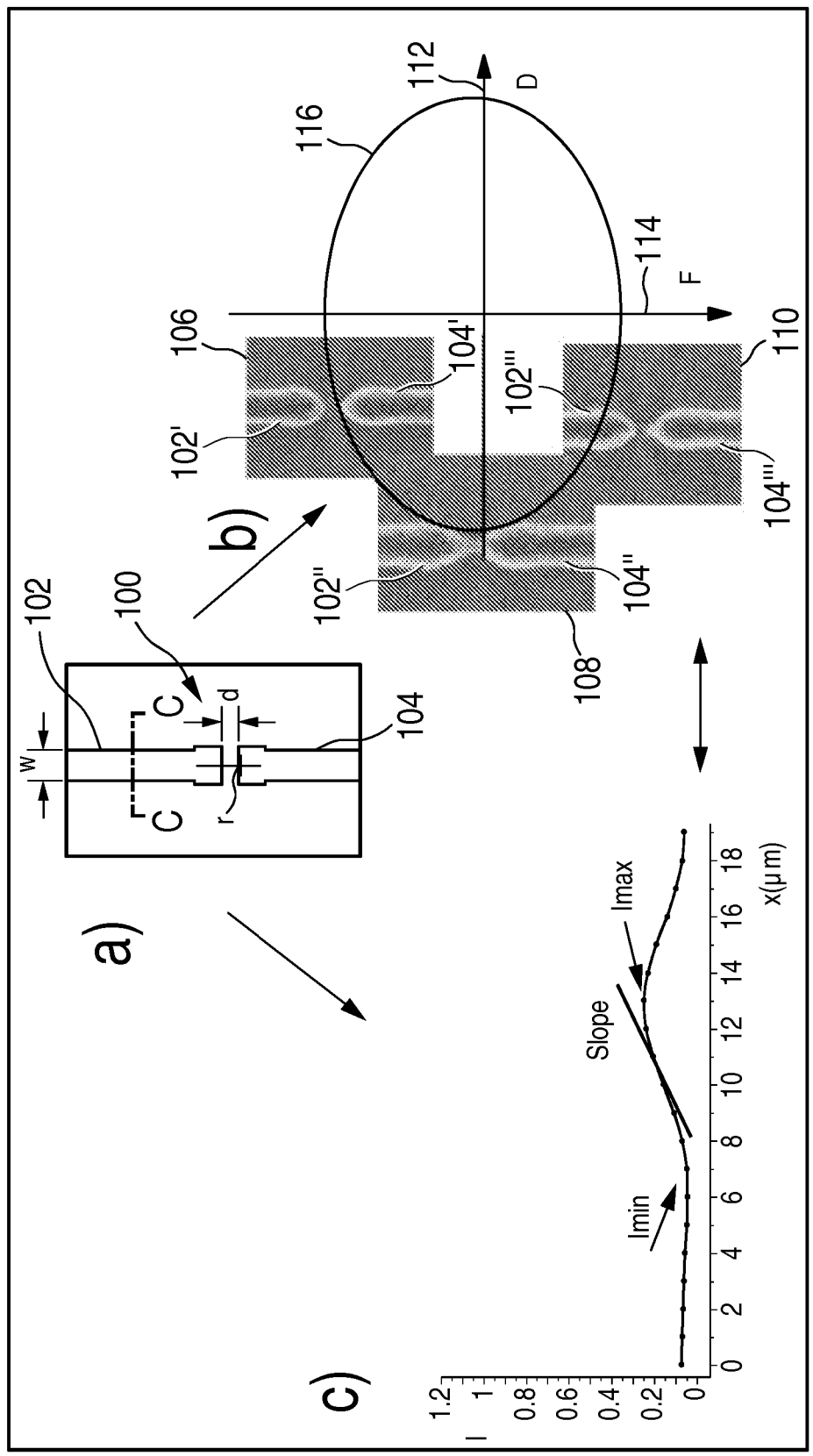
FIG. 1 shows, in FIG. 1a), an illustration of a critical feature; different prints of the critical feature at different respective process conditions within a process window in a schematic diagram in FIG. 1b); and, in FIG. 1c) an intensity profile along a line c-c of FIG. 1a) in an aerial image of the critical feature, for illustration of an optical-parameter set.

FIG. 1 shows an illustration of a critical feature in FIG. 1a), different prints of the critical feature at different respective process conditions within a process window in a schematic diagram in FIG. 1b), and an intensity contour along a line c-c in FIG. 1a) in a print of the critical feature, for illustration of an optical-parameter set. FIG. 1 serves to illustrate the technical context of the invention and certain terms used in the present application.

FIG. 1a) represents, by way of an illustrative example, a critical feature 100 in a physical layout of a print pattern. The critical feature in this example is formed by two line segments 102 and 104 of a material, for instance silicon, which are to be deposited on a substrate, for instance a silicon wafer by means of a photolithographic technique. Both line segments have a width w, which is slightly increased towards the respective line-segment end in comparison with other sections of the line segment. The line-segment ends of the line segments 102 and 104 are facing each other and have a distance d from each other. The line-segment ends facing each other each are rectilinear. In other words, with a view to the line-segment ends as printed in real life, the physical layout defines the line-segment ends to have a curvature with an infinite radius r.

FIG. 1b) shows three different micrographs 106 to 110 obtained by scanning electron microscopy. The micrographs show prints of the critical feature 100 that were made at three respective different process conditions. The process conditions used are characterized by value of an exposure-radiation dose used for exposing a resist layer at the print position of the critical feature 100 and by a used focus position of a mask-image plain relative to a depth level in a resist layer at the position of the critical feature. In FIG. 1b), these two parameters of the process condition are represented in a diagram, whose abscissa 112 corresponds to the exposure-radiation dose D and whose ordinate 114 corresponds to the focus position F. A process window 116 of available combinations of these two process parameters is schematically represented by an elliptical area in the two-dimensional space spanned by the two quantities dose and focus. Only parameter combination inside the elliptical process window 116 are available process conditions for printing the critical feature. The shape of the process window 116 is purely illustrative. In real life, the process window 116 can have a different shape. In particular, the process window need not have a certain geometrical shape in a strict mathematical sense. The shape of the process window can be irregular.

The three images 106 to 110 were taken from prints of the same critical feature 100 in a physical layout of a print pattern. The critical feature was printed at three different process conditions forming three different points of the process window 116. To visualize this fact, the micrographs are arranged at different positions with respect to the process window 116.

The different micrographs 106 to 110 show the critical feature 100 as printed with their respective process condition. As can be seen, all three different micrographs 106 to 110 show the ends of the line segments 102 and 104, which are labeled with the reference numerals 102', 102", 102''', and 104', 104", 104''', respectively. Two main effects of the different process conditions are visible: under all process conditions used, the line-segment ends as printed have a finite radius of curvature, and the distance d between the line segments 102 and 104 varies from process condition to process condition. The largest distance d is observed for the process condition used in printing the critical feature display in image 106. Here, the line-segment ends are clearly separated from each other. Under the process condition used for printing the critical feature 100 as displayed in image 110, the distance d between the line-segment ends 102''' and 104''' is reduced in comparison with that of the line-segment ends 102' and 106'. While the line segments are not connected yet under this process condition, an onset of a bridging between the line segments 102 and 104 is visible at the end of line segment 104 in the image 102" and 104'''. For the process condition used for printing the critical feature 100 as displayed in the image 108, the distance between the line segments 102" and 104" is bridged so that the line segments are in fact connected. This bridging between the two printed line segments 102" and 104" represents a clear printing failure and would lead to a malfunctioning of a device containing the critical feature 100 fabricated under the process condition underlying the image 108.

These "real-life observations" obtained from prints of a test pattern can, as an alternative that is used in the context of the method of the present invention, also be obtained from print simulations, as is known per se. FIG. 1c) shows an aerial image along a line c-c in FIG. 1a) as calculated in a print simulation. The diagram of FIG. 1c) shows a calculated exposure-light intensity of a focused mask image at a certain depth in the resin in arbitrary linear units, as a function of the lateral position in units of nanometer. Individual calculated intensity values are represented by small full circles and interconnected by a line. The circles thus represent individual calculated print-simulation data for the line c-c in FIG. 1. The intensity distribution has a peak extending over the range of approximately 12 nm, representing the intensity of the exposure-light in an aerial image of the line segment 102 along the line c-c of FIG. 1a).

From the intensity distribution of FIG. 1c), optical parameters can be extracted. Three optical parameters are indicated in FIG. 1c): a minimum intensity at the onset of the intensity peak representing the line segment 102 along the section c-c, a slope of the intensity increase as measured at a predetermined intensity threshold value, represented by a tangent to the intensity distribution at the corresponding point, and a maximum intensity Imax of the peak.

The three partial FIGS. 1a) to 1c) of FIG. 1 represent initial steps of a method for calibrating a critical-failure model regarding a printing failure of a critical feature in a physical layout of a print pattern. The physical layout at the position of the critical feature is represented in FIG. 1a). FIG. 1b) shows the printing behavior of a single test pattern, which has the critical feature at different points of a process window. In the example of FIG. 1, the printing behavior is observed in actual prints of the test pattern. This does not correspond to the proceeding of the method of the invention, which is based on the use of print-simulation data obtained by calculating print simulations of different test patterns, which have the critical feature, wherein the different test patterns differ between each other in their respective values of the geometrical parameter of the critical feature. In summary, FIG. 1c) shows, by way of an example, the extraction of a predefined optical-parameter set from test-print-simulation data at the print position of the critical feature.

Figure 2:
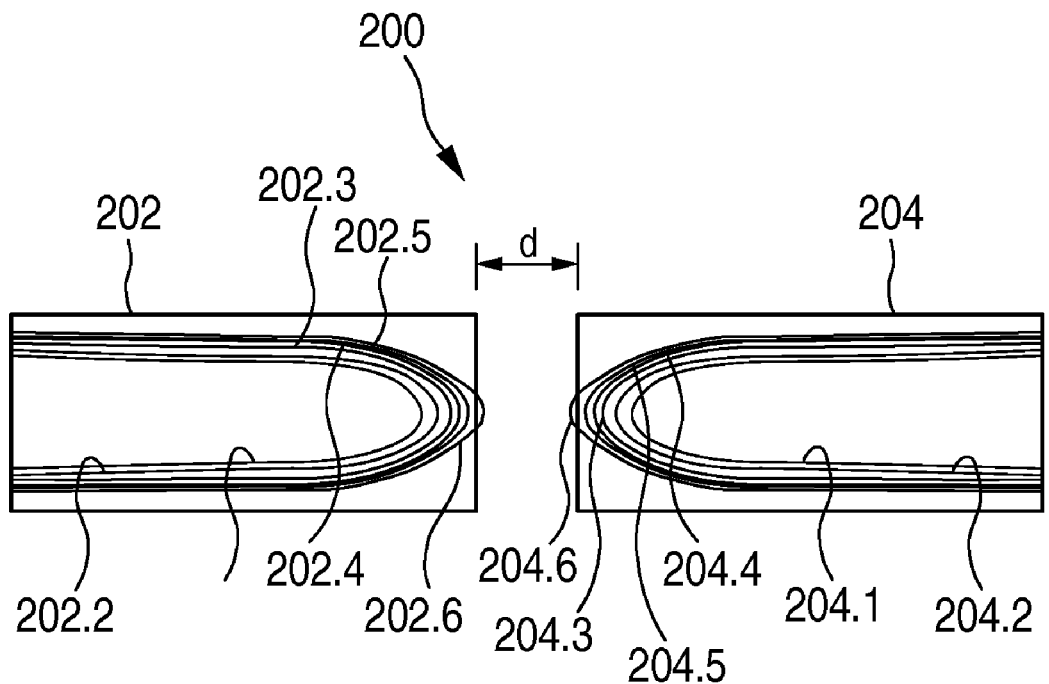
FIG. 2 shows another example of a critical feature together with print contours derived from print-simulation data calculated for different process condition.

FIG. 2 shows another example of a critical feature 200 together with print contours derived from print-simulation data calculated for different points of a process window. Print contours can be calculated from an aerial image using a print threshold intensity for a print process, taking into account properties of a particular resin employed in the process by means of a resin model.

FIG. 2 allows a comparison of a critical feature 200 represented by two rectangular line segments 202 and 204 arranged at a distance d from each other with their respective line-segment ends. With print simulations of a test pattern obtained at different process conditions, i.e., at different points of a process window. The print simulations are represented by outer contour lines 202.1 to 202.6 and 204.1 to 204.6 derived from test-print-simulation data calculated for a test pattern represented by the critical feature 200. As can be seen from a comparison with FIG. 1), print simulations deliver equivalent information on printing failure in a manner that corresponds to the information obtainable from the micrographs 106 to 110 taken from actual test prints. Print simulation techniques per se, which are suitable for obtaining such test-print simulation data, are well known in the art.

The following description of FIGS. 3 to 7 turns to the previously mentioned interrelation between an optical-parameter set extracted at one sampling point of a process window from test-print simulation data, on one side, and the print behavior of the corresponding critical feature throughout the whole process window, on the other side. The method for calibrating a critical feature model disclosed in this application uses this link in applying a failure rule derived from the interrelation. This allows reducing the calculation expenditure in obtaining a calibrated critical-failure model regarding a printing failure of a critical feature in a physical layout of a print pattern. For test-print-simulation data for a respective test pattern have to be calculated and evaluated only at the sampling point of the process window, and not throughout the process window. The description of FIGS. 3 to 7 serves to provide exemplary considerations underlying the formulation of a failure rule used in the calibration procedure disclosed herein, for enabling the skilled person to apply similar considerations in determining failure rules for any application case. The embodiments of the invention described herein make use of a failure rule.

Figure 7:
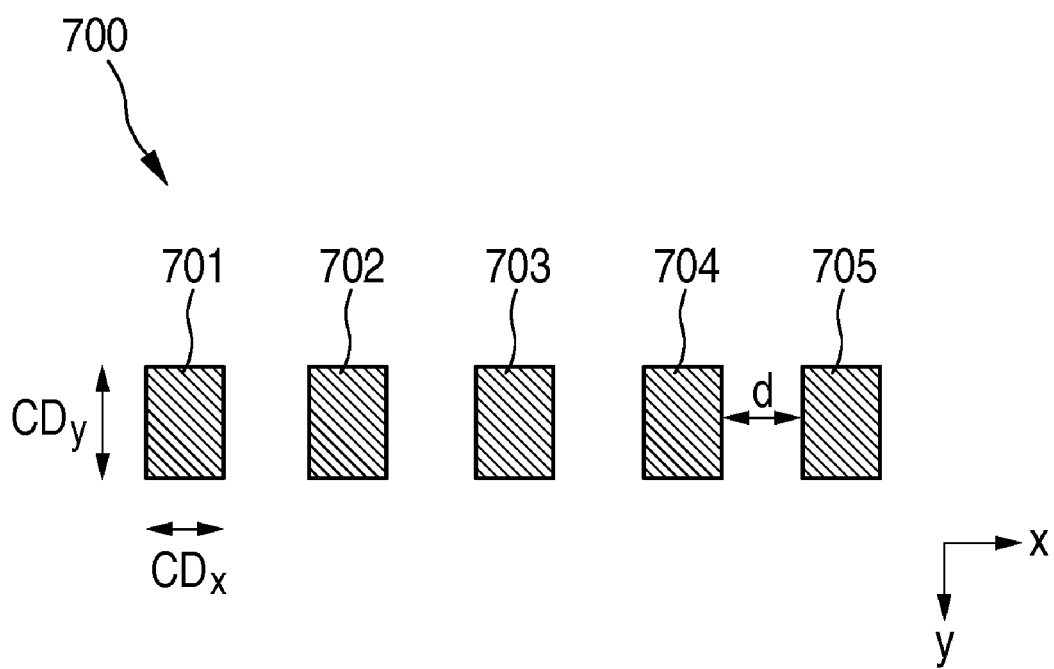
FIG. 7 illustrates test patterns used for the print simulations of FIGS. 3 to 6.

FIGS. 3 to 6 show different intensity distributions of aerial images of different test patterns as obtained from test-print-simulation data calculated by print simulations along a line III-III indicated in FIG. 7. As in FIG. 1c), the intensity of a simulated aerial image along the line III-III is plotted in linear arbitrary units as a function of the position in micrometer. Seven different test patterns of the type shown in FIG. 7 were used in the test-print simulations. The following description will therefore first turn to FIG. 7, before returning to FIGS. 3 to 6.

FIG. 7 illustrates an example test pattern showing a range of five rectangular contact structures 701 to 705 with a mutual spacing d in an x-direction, which is indicated by an error, and with a respective lateral extension $CD_x$ in the x-direction and $CD_y$ in a y-direction, which extends perpendicular to the x-direction. The line III-III extends in x-direction across the contact structures 703 and 704 of the test pattern 700 shown in FIG. 7. For obtaining the different line-scan intensity distributions along the line III-III shown in FIGS. 3 and 4 from simulated aerial images, seven test patterns of the kind shown in FIG. 7 were used with varying size of the contact structures 701 to 705 ($CD_x$, $CD_y$) and varying distance d between each other. The intensity distributions of respective test patterns are shown with different respective line types. Identical line types used in both FIGS. 3 and 4 indicate that identical test patterns were used for the respective print simulations. Generally, test patterns should be used, which accurately describe a configuration containing the critical feature present in a design.

Figure 3:
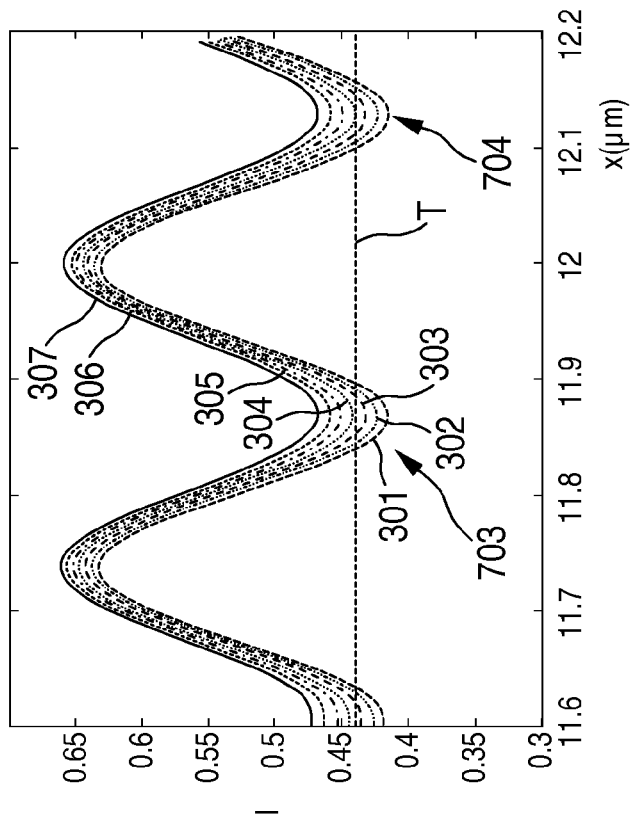
FIGS. 3 to 6 show test-print simulations in the form of intensity profiles of aerial images of different test patterns having a critical feature for respective different process conditions.
Figure 4:
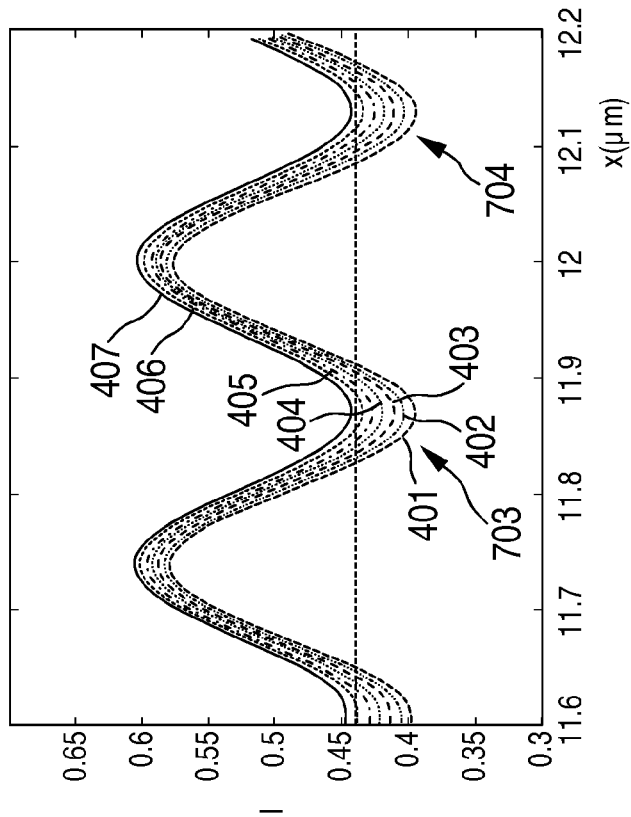

The simulated aerial images shown in FIG. 3 differ from those shown in FIG. 4 in the process conditions used for the simulation. The simulations shown in FIG. 3 were performed using as a process-window-point a nominal focus position of the process and a nominal exposure-light dose, while the simulations shown in FIG. 4 were performed using a focus deviation of +125 nm from the nominal focus position, and the same exposure-light dose as in FIG. 3.

In both diagrams, a dotted line T represents a print-threshold intensity. A negative-resist model is used for the print simulation in this example. A negative resist is a type of photoresist, in which a portion of the photoresist that is exposed to light of an intensity above the print-threshold intensity becomes relatively insoluble to a photoresist developer and prevents a material deposition on the underlying substrate. The portion of the photoresist that is unexposed, or exposed to light of an intensity below the print threshold, is dissolved by the photoresist developer, thus enabling a later material deposition on the substrate underlying this portion for printing the desired structure. That means that an intensity of the aerial image below the print-threshold intensity T will result in a printed structure after removal of the resin while an intensity above the print-threshold intensity will not result in a printed structure.

The test print simulations shown in FIG. 3 indicate that for the test patterns represented by the intensity distributions 304 through 307, the contacts 703 and 704 will not be printed due to the high minimum intensity Imin at the respective structure positions in the aerial image. Only test prints for the test patterns represented by the intensity distributions 301 to 303 will show the contact structures 703 and 704 with strongly reduced width in comparison to $CD_X$. The lateral extension of the printed structure in x-direction decreases from the test pattern used for the intensity distribution 301 to the test pattern of intensity distribution 303. That means, pinching is observed for the test patterns represented by intensity distributions 304 to 307. For a defocus of +125 nm, as shown in FIG. 4, the pinching is only slightly reduced.

From intensity distributions such as those of FIGS. 3 and 4 it is also possible to extrapolate the behavior of the test patterns under a variation of the exposure dose. For modifying the exposure dose can be simulated by varying the print-threshold intensity T away from its nominal position shown in FIGS. 3 and 4. An underexposure can thus be modeled by an increase of the print-threshold intensity value, and an overexposure can be simulated by a decrease of the print-threshold intensity value. Therefore, one can derive from FIGS. 3 and 4 that a lowering of the threshold T increases the pinching phenomenon. In other words, the risk of pinching increases as minimum intensity increases and the slope the exposure dose increases. Thus, taking the nominal process conditions as the sampling point of the process window, it can be derived that printing is critical at the sampling point for the optical parameter sets derivable from FIGS. 3 and 4 and becomes even more critical when moving away from the sampling point in direction of increasing exposure doses, while becoming less critical when moving in direction of lower exposure doses. Varying the focus in positive direction will not alter the criticality much.

The link between the optical parameters and the failure observation can be made by several ways, e.g., mathematical regression, application of statistical models, etc.

Figure 6:
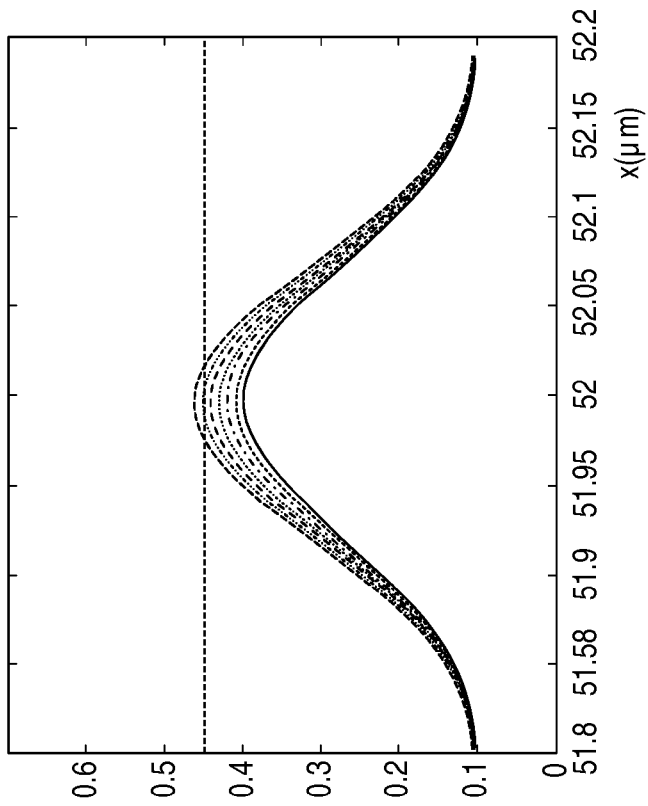
Figure 5:
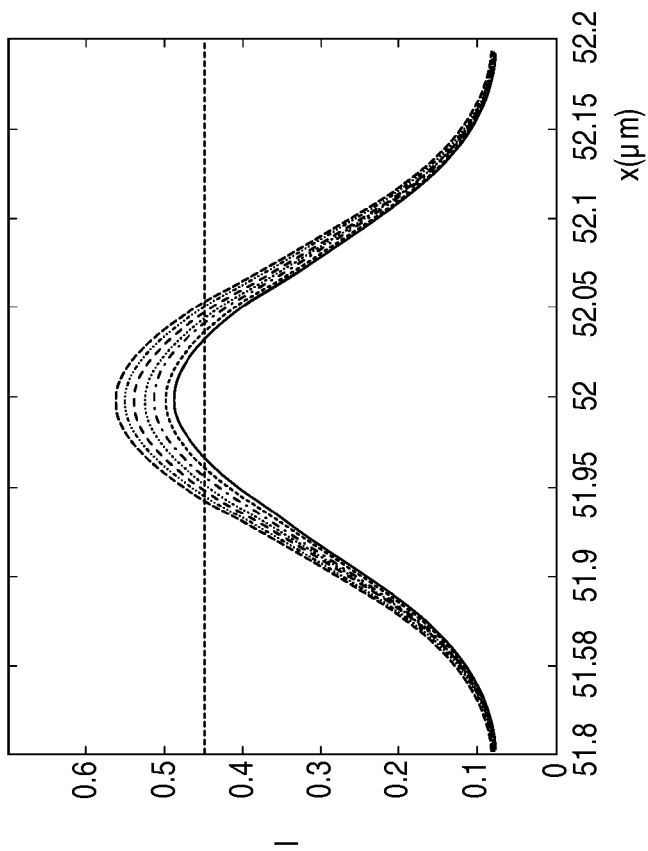

The phenomenon of bridging is illustrated by the diagrams of FIGS. 5 and 6, which show intensity distributions of aerial images of different test patterns as obtained from test-print-simulation data calculated by print simulations. In comparison with FIGS. 3 and 4, the contact structures of the test patterns used for the simulations in FIGS. 5 and 6 still correspond to that shown in FIG. 7, but have a smaller distance d from each other in x-direction and are larger in size. The distance is well resolved in the aerial images used for the line scan intensity profiles shown in FIG. 3. All intensity profiles of FIG. 5, which simulations for shows nominal process conditions, have a maximum intensity Imax above the print-threshold intensity in the range between the contact structures. Note that for the two cases of FIGS. 3 and 4, the intensity is generally higher because the size of the contact structures is smaller and the space between them is larger in comparison with those used for FIGS. 5 and 6. As a consequence, the amount of light reaching the resist surface is smaller for the cases of FIGS. 5 and 6. The difference seen is thus due to density variations between the structures. It is not due to normalization or different exposure conditions.

A maximum intensity Imax above the print-threshold intensity in the range between the contact structures implies that the photoresist in these regions will be solved in a solvent and afterwards removed with a developer. As a result, a hole is written in the resist, forming the contact. However, bridging is observed when moving from the nominal process conditions to a defocus of +125 nm. The minimum intensity Imin at the position of the contact structures remains substantially constant, but the maximum intensity in the spacing is reduced in comparison with the profiles of FIG. 5, and so is the slope at the edges of the intensity peak between the contact structures 703 and 704. Therefore, the risk of bridging increases when moving away from the nominal focus position to a positive defocus. The bridging phenomenon is amplified if the exposure dose is reduced and if the defocusing is increased.

In summary of the foregoing description of FIGS. 3 to 7, the optical parameters, which can be extracted from the aerial image are linked to printing errors occurring at certain points in the process window. A pinching appears when the minimum intensity Imin between the contacts is elevated, i.e., close to print-threshold intensity T, and when the slope of the aerial image is weak. The risk of a pinching print failure increases when the exposure dose is increased, and remains essentially constant if the focus is moved away from the nominal focus position. Similarly, the risk of bridging of the resin within a contact can be characterized by a weak maximum intensity Imax, i.e. close to the print threshold T and a weak slope. The bridging phenomenon is amplified if the exposure dose is reduced and if the defocusing is increased.

The extraction of parameters at one single process condition suffices to understand the behavior of the structure when a variation of the dose or of the position of the focal plain within the resin is changed. Note that since the errors of bridging and pinching are not correlated with each other, it is necessary to generate to different calibrated models for these different print failures. Generally, an individual failure rule must be derived for each critical feature and each process technology.

These simple examples show that it is possible to predict print errors across the process window on the basis of optical parameters extracted from the print-simulation data at a single process-window point, which is herein called the sampling point of the process window. In other words, optical parameters extracted at one sampling point of the process window can be extrapolated to their respective values at different points of the process window throughout the whole process window. The sampling point is in one embodiment a point of successful printing. A central point of the process window is advantageous as a sampling point to be able to cover process deviations in different directions within the process window.

Note that the invention is applicable independent of the type of photoresist and printing process used. A failure rule can also be derived for a positive photoresist making use of similar print simulations and evaluations as described above for the case of a negative resist. A positive resist is a type of photoresist, in which the portion of the photoresist that is exposed to light of an intensity above the print-threshold intensity becomes soluble to a photoresist developer and the portion of the photoresist that is unexposed or exposed to light of an intensity below the print threshold remains insoluble to the photoresist developer.

Figure 8:
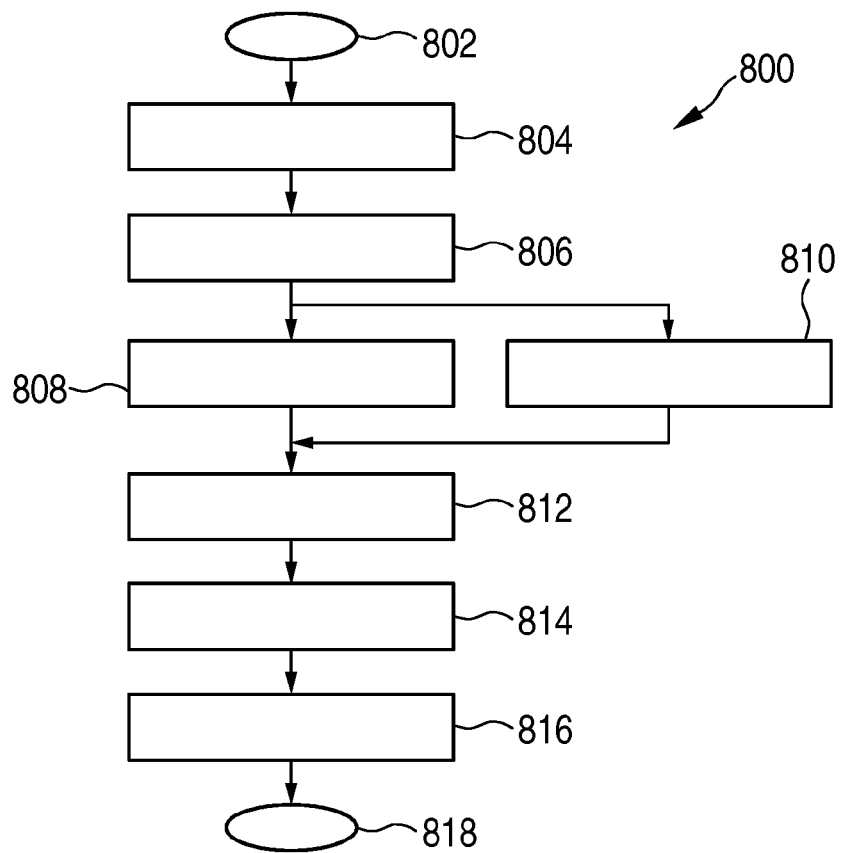
FIG. 8 shows a flow diagram of a method for calibrating a critical-failure model regarding a printing failure of a critical feature in a physical layout of a print pattern.

FIG. 8 shows a flow diagram of a method 800 for calibrating a critical-failure model regarding a printing failure of a critical feature in a physical layout of a print pattern. The method starts at step 802. At a step 804, a print-failure criterion is provided for a critical feature. The critical feature can be a structure that can be subject to bridging or pinching, by way of example. The print-failure criterion relates to one of these print failures in providing a relation concerning a geometrical parameter in the print of the critical feature as derived from test-print-simulation data simulating the print. The test-print-simulation data can for instance be an aerial image or a print contour derived from an aerial image of a test print. A print-failure criterion for pinching of a line in the print pattern would for instance comprise a lower limit value for a width of an intensity profile at the print-threshold intensity in an aerial image of the line in the print simulation. A suitable print-failure criterion for bridging of neighboring lines in a print pattern would for instance comprise a lower limit value for a distance between the two lines at the print-threshold intensity in an intensity profile of the two lines in the print simulation.

In a subsequent step 806 test-print-simulation data are provided, which represent print-simulations of different test patterns, which have the critical feature. The different test patterns differ between each other in their respective values of the geometrical parameter of the critical feature comprised by the print-failure criterion. The test-print-simulation data can be provided from an external source, be it at this time of the processing of the method, or at an earlier time in the process or before the beginning of the process. Test-print-simulation data provided at an earlier stage can stored and then accessed at the present point of the processing. In another embodiment the test-print-simulation data are provided in that they are generated at this processing stage or before as a part of the process, by performing test-print simulation calculations in the device that is performing the present method.

From the test-printing data, a predefined optical-parameter set is derived at the print position of the critical feature in step 808. As mentioned, the optical-parameter set can for instance comprise the minimum intensity of an aerial image of the test pattern at the print position of the feature, a slope of the intensity profile of an aerial image of the test pattern at the print position of the critical feature at a predefined threshold position between the minimum and maximum intensity, and any composite optical parameter derived from these previously mentioned parameters. Suitable optical parameters should be chosen in dependence on the critical feature to be modeled.

The predefined optical-parameter set is ascertained from the test-print-simulation data at only one sampling point of a process window, which sampling point is identical for all test patterns. Consequently, it is only required to provide test-print simulations for the sampling point of the process window. An example of a suitable sampling point of the process window are the nominal process conditions of focus and exposure dose set for exposing a given photolithographic resin. The process window extends for a certain focus interval and a certain exposure-dose interval around these nominal process conditions. The sampling point may thus suitably form a central point of the process window, and the process window covers variations of the process conditions from the nominal process conditions to higher and lower values.

In parallel, in a step 808, the test-print-simulation data are scanned for the occurrence of print failure according to the print-failure criterion (step 810). Subsequently, the at least one failure rule, which has been provided, is applied. The failure rule is typically present in form of a mathematical function or a look-up table, which correlates an input of an optical-parameter set to a criticality trend information at a different process-window point. The application of the failure rule provides trend information for points in the optical-parameter space. The trend information is indicative of a trend of the geometrical parameter in a print of the critical feature of a respective test pattern when moving from the sampling point in the process window to a different process-window point. The trend information can for instance take the form of an extrapolation of a print-criticality level, e.g., "pass" or "fail", or more differentiated levels, from the sampling point to the different process-window point.

Subsequently, in the present embodiment, a criticality-indicator value is ascertained in step 814 for a larger number of optical-parameter-set values throughout the optical-parameter space. The criticality-indicator value is indicative of respective degree of criticality of a print of the critical feature according to the print failure criterion, as derived from the failure rule and the print simulation. The criticality-indicator depends on a detected presence or absence of a print-failure at the sampling point of the process window. It further depends on the trend of the geometrical parameter of the test pattern predicted by the failure rule when moving to a different process window point. For example, the criticality indicator can be defined to correspond to a normalized distance between the sampling point of the process window and a nearest process-window point, at which the respective criticality-indicator value exceeds a predetermined threshold value.

Subsequently, the optical-parameter space is classified into regions according to at least two print-criticality levels using the detected print failures in the test-print simulations at respective points of the optical-parameter space (Step 816). In this embodiment, where a criticality indicator with the given definition is used, the classification can be made according to intervals of the criticality indicator. In other embodiments the classification can be performed according to the different criticality levels determined at the sampling point and derived for other points of the process window.

Therefore, with completing the classifying step 816, a calibrated critical-failure model regarding a printing failure of a critical feature in a physical layout of a print pattern is provided. The model can be used by inputting a set of optical parameters and receiving a criticality level. The obtained criticality level can be used to correct the physical layout, as will be described with reference to FIG. 9 below.

In summary, the method for providing a calibrated critical-failure model of FIG. 8 can be described as follows:

| | |
|---|---|
| Step 802 | Start |
| Step 804 | Provide print-failure criterion |
| Step 806 | Provide test-print-simulation data |
| Step 808 | Extract optical parameter set from test-print simulation data |
| Step 810 | Scan test-print-simulation data for presence of print failures |
| Step 812 | Provide and apply failure rule to optical-parameter sets |
| Step 814 | Derive criticality-indicator values |
| Step 816 | Classify the optical-parameter space according to print-criticality levels |
| Step 818 | End |

Figure 9:
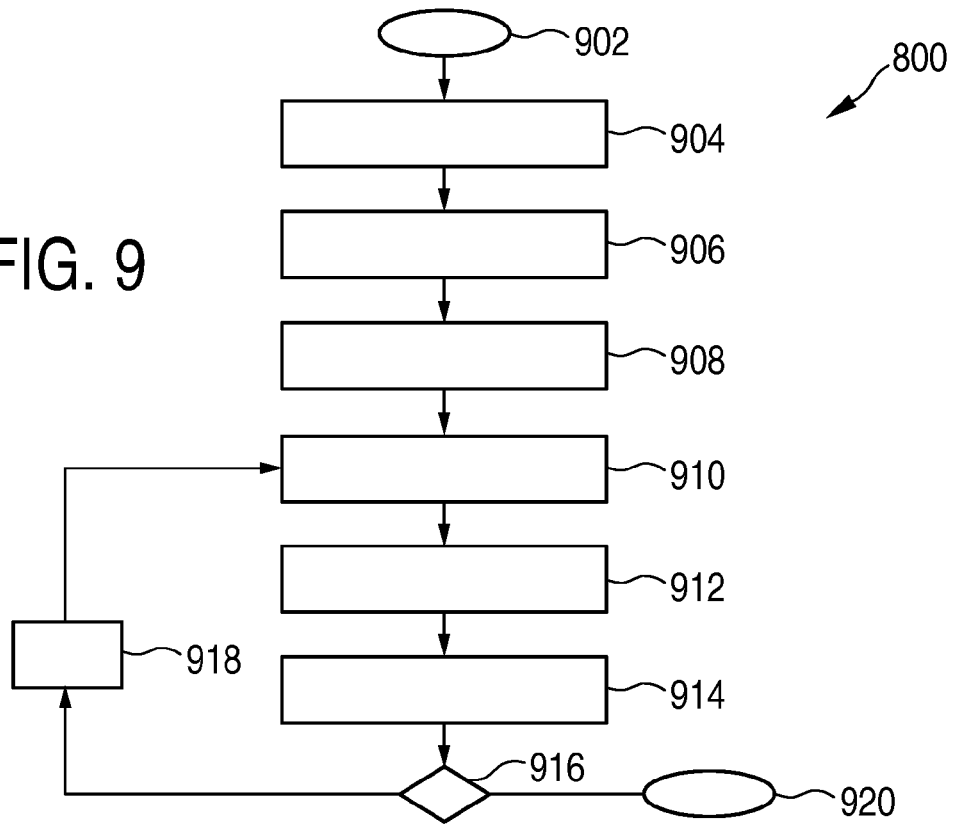
FIG. 9 shows a flow diagram of a method for correcting a critical feature in a physical layout of an integrated circuit.

FIG. 9 shows a flow diagram of a method 900 for correcting a critical feature in a physical layout of an integrated circuit.

The method 900 for correcting a critical feature in a physical layout of an integrated circuit starts with a step 902. In a step 904 a calibrated critical-failure model regarding a printing failure of a critical feature is provided. Thus, step 904 can be performed by following the process steps 802 to 818 of FIG. 8. In another embodiment a model previously obtained by performing the method 800 of FIG. 8 is provided in a memory or as an input to the process flow of FIG. 9.

In a step 906, physical-layout data representing the physical layout of the integrated circuit is provided. The physical-layout data can be restricted to a region of interest. In particular, the region of interest can be a region, in which a printing failure is expected. However, it is also possible and useful in one embodiment to provide the full layout of an integrated circuit on a given mask level. Subsequently, the physical-layout data is scanned for detecting an occurrence position of the critical feature in the physical layout in step 908. Then, at the detected occurrence positions of the critical feature, a print simulation of the physical layout is performed in step 910. This results in print-simulation data, which typically are represented by an intensity distribution of an aerial image as described in previous sections of this application.

Subsequently, a predefined optical-parameter set is extracted from the print-simulation data regarding the critical feature. The optical-parameter set extracted at this point in step 912 corresponds to the optical-parameter set, on which the critical-failure model provided in step 904 is based. The optical-parameter set is extracted from the print simulation at the occurrence positions of the critical feature.

Then, in a step 914, the provided critical-failure model is used to determine criticality levels for the extracted optical-parameter sets at the occurrence positions of the critical feature. It is then checked in a step 916, whether the ascertained criticality level is above a predefined threshold level of the print criticality. If yes, the method branches to step 918 to modify the physical layout and continue with obtaining new print-simulation data of the modified physical layout at the occurrence position of the critical feature (step 910). In the modifying step, known algorithms of optical proximity correction can be used. The sequence of steps 910 to 918 is repeated until in step 916 it is determined that the print-criticality level ascertained in step 914 is below the predefined threshold value. In this case, the method ends with step 920. In summary, the method 900 for correcting a critical feature in a physical layout of an integrated circuit can be summarized as follows:

| | |
|---|---|
| Step 902 | Start |
| Step 904 | Provide calibrated critical-failure model |
| Step 906 | Provide physical-layout data |
| Step 908 | Detect occurrence positions of critical feature in the physical layout |
| Step 910 | Perform print simulation at occurrence positions of the critical features |
| Step 912 | Extract optical-parameter set from print simulation |
| Step 914 | Ascertain print-criticality level from the critical-failure model |
| Step 916 | Is criticality level below a predefined threshold? |
| Step 918 | If no: Correct the physical layout using OPC algorithm |
| Step 920 | If yes: End |

Figure 10:
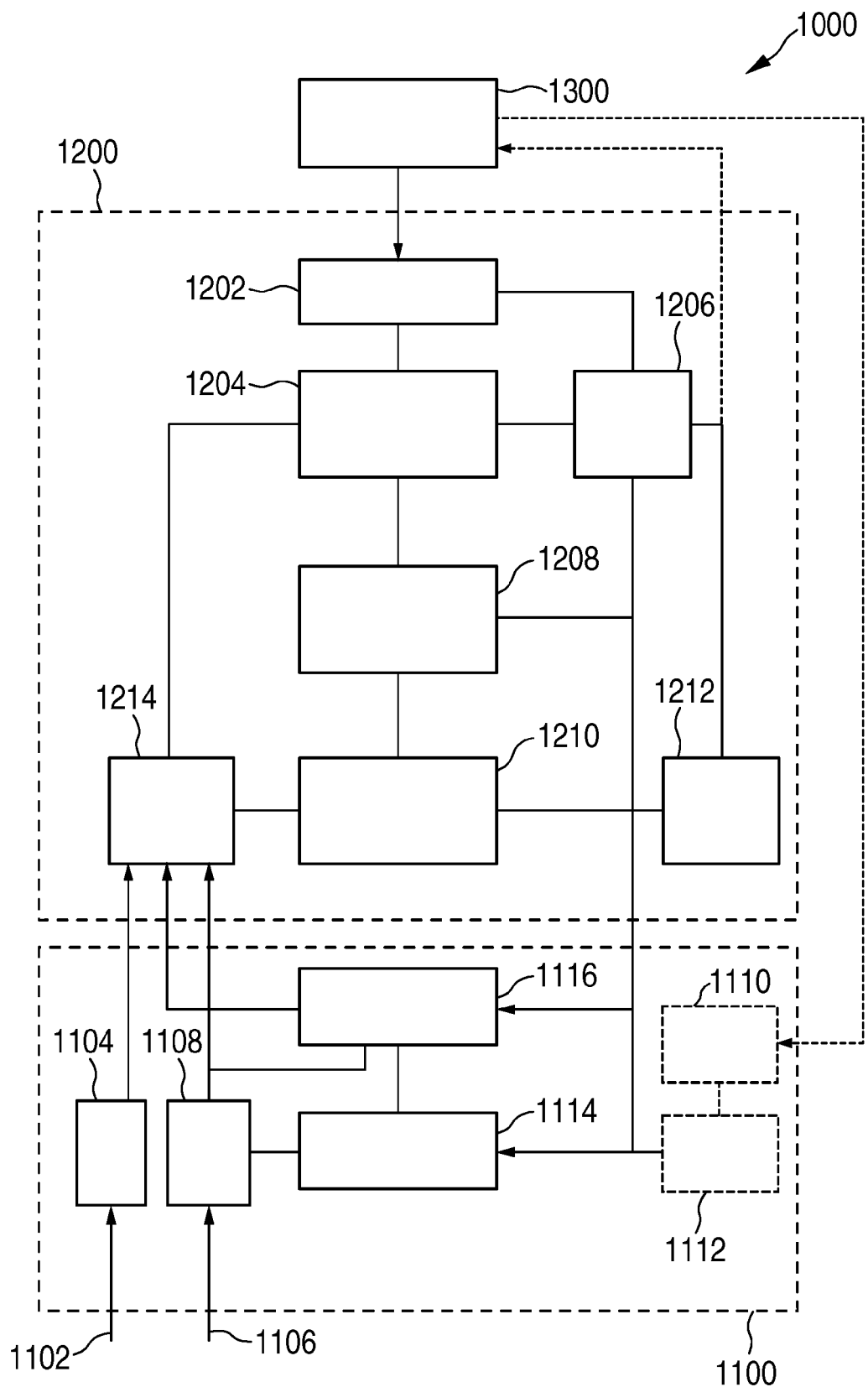
FIG. 10 shows a schematic block diagram of an apparatus for calibrating a critical-failure model regarding a printing failure of a critical feature in a physical layout of a print pattern and for designing and correcting a critical feature in a physical layout of an integrated circuit.

FIG. 10 shows a schematic block diagram of a system 1000 for calibrating a critical-failure model regarding a printing failure of a critical feature in a physical layout of a print pattern and an apparatus for designing and correcting a critical feature in a physical layout of an integrated circuit. The block diagram of the system of FIG. 10 is simplified to only show the essential structural elements that characterize the present embodiment. The system 1000 contains an apparatus for providing a calibrated critical-failure model 1100 and an apparatus 1200 for correcting a critical feature in a physical layout of a print pattern. The system 1000 can be integrated to form a single device, for instance in the form of a computer.

However, the apparatus 1100, which hereinafter will also be referred to as the modeling apparatus 1100, and the apparatus 1200, which hereinafter will also be referred to as the correcting apparatus 1200, can also be implemented as separate devices. It is not a requirement, that the modeling apparatus 1100 and the correction apparatus 1200 operate at the same time. However, simplifications are possible, if the modeling apparatus and the correction apparatus 1200 are implemented as an integrated system.

In the following, the modeling apparatus 1100 will be described. The apparatus has an input 1102. The input 1102 serves to provide a definition of a critical feature. The definition for instance comprises a representation of a geometrical shape and a definition of one or more geometrical parameters characterizing the geometrical shape and its critical feature. The definition of the critical feature provided via input 1102 can for instance take the form of a code in a certain code language interpreted by the modeling apparatus 1100. The critical feature definition is stored in a memory 1104.

Through an input 1106, a print-failure criterion can be provided by an external input device. This can be realized as a graphical user interface allowing user input on a keyboard. The print-failure criterion is stored in a failure-rule unit 1108. The print-failure criterion can also be provided in the form of a predefined code. Details of the failure-rule unit will be described later in the context of the description of a model-calibration unit 1116.

In an embodiment, where the modeling apparatus 1100 forms a stand-alone unit, it has a test-print simulator unit 1110, which is configured to calculate test-print-simulation data representing print simulations of different test patterns, which have the critical feature. The test patterns can be provided to the test-print simulator unit 1110 by an external layout design unit 1300 that can for instance provide the layout of the test patterns in an abstract language such as VHDL.

In the embodiment of a stand-alone unit, a test-print evaluation unit 1112 is provided, which is connected with the test-print simulator unit 1110. The test-print evaluation unit serves for extracting an optical parameter set from the test prints. The test-print evaluation unit can be realized on the basis of known software, such as a software program Calibre. Note that according to the method of the present invention, the test-print-simulation data represent print simulations of different test patterns calculated for only one sampling point of a process window. The sampling point is identical for all test patterns.

A print-failure detection unit 1114 is connected with the test-print evaluation unit 1112 and the test-print simulator unit 1110. The print-failure detection unit 1114 is configured to scan the test-print-simulation data or, in another embodiment, the optical-parameter set derived from that for the presence of print-failures according to the print-failure criterion stored in the failure-rule unit 1108. The print-failure criterion relates to a geometrical parameter of the critical feature in a print of the critical feature, as derived from the test-print simulation data A model-calibration unit 1116 is connected with the print-failure unit 1114. The model-calibration unit is configured to classify regions in an optical-parameter space spanned by at least one optical parameter of the optical-parameter set according to at least two print-criticality levels and to provide at its output a print model comprising allocations of respective criticality levels of respective points in the optical-parameter space. The parameters used for the optical-parameter space can in one embodiment be defined by user input.

The model-calibration unit is connected with the failure-rule unit 1108. The failure-rule unit 1108 is configured to apply the stored failure rule. The application of the failure rule to a given point in the optical-parameter space provides trend information for the given point in the optical-parameter space. The trend information is indicative of a trend of the geometrical parameter in a print of the critical feature of a test pattern when moving away from the sampling point in the process window to a different process-window point, for this particular point in the optical parameter space. The trend information is output by the failure-rule unit and provided to the model calibration unit.

The model-calibration unit 1116 is configured to ascertain the respective print-criticality levels from the test-print-simulation data at respective points of the optical-parameter space, at the sampling point and at least one different process-window point using the failure rule and to provide this print-criticality data at its output. This forms the failure model. Thus, the result given by the failure model will not only tell whether or not a pattern will print correctly but it will also give the position in the process window where a failure will occur.

In one embodiment, the failure-rule unit 1108 is an integrated part of the model-calibration unit.

The modeling apparatus 1100 is in a preferred embodiment provided in the form of a computer with a carrier medium carrying computer-readable code for controlling the computer to implement the described functionalities. The modeling apparatus thus is driven by computer-readable code to carry out a method of the first aspect of the invention or one of its embodiments. In another embodiment, the modeling apparatus 1100 is forms a hardware implementation, which contains one or more integrated circuits carrying out the described functionalities. A combination of both techniques can be useful, in which some functionalities are carried out by dedicated hardware to accelerate certain computation steps, and other functionalities are performed by a software-controlled computer.

The following description turns to the correction apparatus 1200. The correction apparatus has a layout input 1202 for receiving physical-layout data representing the physical layout of a print pattern, in particular, of an integrated circuit.

A layout-scanner unit 1204 is connected with the layout input 1102. The layout-scanner unit is configured to detect, using the physical-layout data, an occurrence position of the critical feature in the received physical layout. The layout-scanner unit has access to a memory that carries the print-failure criterion.

A print-simulator unit 1206 is provided, which is configured to calculate print-simulation data representing a print simulation of a region of the integrated circuit to be printed, which comprises the detected occurrence position of the critical feature, and to provide at its output print-simulation data representing the print simulation.

Connected with the output of the print-simulator unit 1206 and of the layout scanner 1204 is an optical-parameter extraction unit 1208. The optical-parameter extraction unit is configured to extract at least one optical parameter of the critical feature from the received test-print simulation data at the occurrence position of the critical feature. The optical parameter corresponds to the optical-parameter set used in the critical-failure model.

In an embodiment that integrates or connects the modeling unit 1100 and the correction unit 1200, the print-simulator unit and the optical-parameter extraction unit are shared by both units 1100 and 1200, and no separate test-print simulator 1110 and test-print evaluation unit 1112 needs to be provided in the modeling unit 1100. For this reason, the test-print simulator 1110 and test-print evaluation unit 1112 are shown with a dashed outline in FIG. 10.

The correction unit 1200 further has a classification unit 1210, which is configured to ascertain a print-criticality level of the critical feature at the occurrence position from a critical-failure model. The critical-failure model is provided in a memory 1214.

A correction unit 1212 connected with the classification unit is configured to change a geometrical parameter of the critical feature in the physical layout at the occurrence position if the critical feature has an ascertained print-criticality level above a predefined threshold value.

Figure 11:
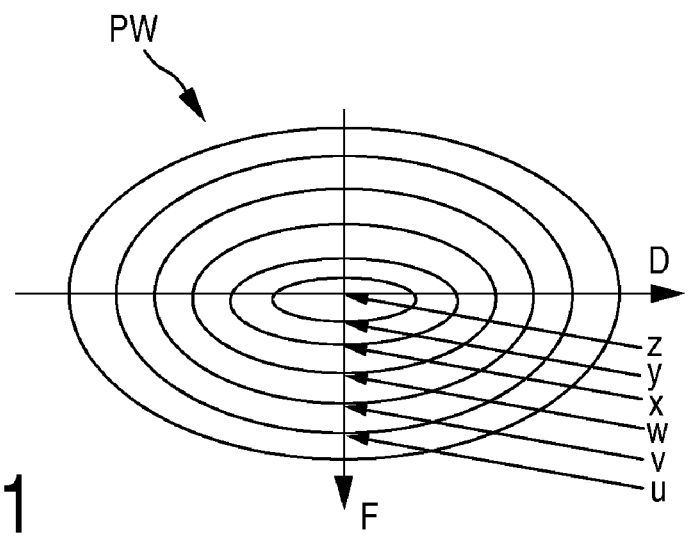
FIG. 11 shows a diagram illustrating a description of a process window.
Figure 12:
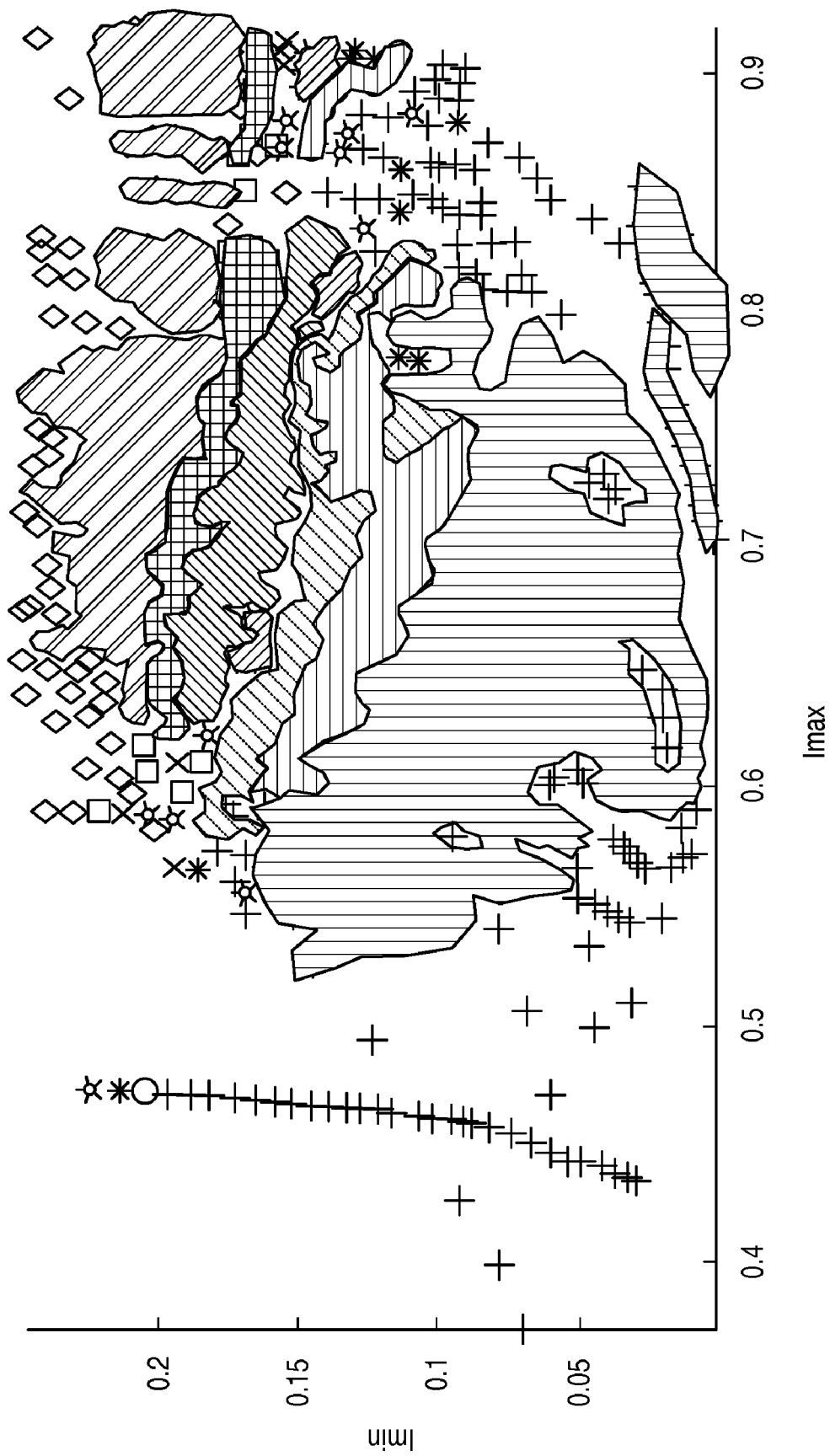
FIG. 12 shows a diagram representing a critical-failure model.

FIG. 11 shows a diagram illustrating a description of a process window PW. FIG. 12 shows a diagram representing the output of a critical-failure model using the partition of the process window shown in FIG. 11. The process window, which is spanned by the parameters focus F and dose D as described before, is partitioned according to FIG. 11 into focus and dose regions of elliptical or oval shape labeled with letters u to y in alphabetical order and having a decreasing extension or distance to the center of the process window (sampling point), which is labeled with the letter z. The graphical description given in FIG. 11 is of exemplary nature only. Other descriptions of the process window can be used, for example based on a circular or rectangular partition. The description need not be linked to a geometrical shape. It can also be based on purely algebraic criteria.

The diagram of FIG. 12 is a classification of an optical-parameter space formed by the parameters Imin and Imax described before. The classification is based on a large number of test patterns. To each symbol shown corresponds an individual test structure resulting in a respective optical-parameter set (Imin, Imax). The symbols used are differentiated according to the point of the process window according to the description of FIG. 11, at which printing failure occurs, in the following way:

Crosses indicate that a pattern having the given optical-parameter set will print correctly throughout the process window. Where many crosses are so closely spaced that they merge in the graphical representation, a vertical hatching is used.

Open circles are used to indicate that a parameter set gives rise to a print that becomes critical at the range u away from the sampling point z. A coherent field of circles is marked by horizontal hatching.

Asterisks are used to indicate that a parameter set gives rise to a print that becomes critical a v in the process window. A coherent field of asterisks is marked with a dotted diagonal hatch.

Open asterisks are used to indicate that a parameter set gives rise to a print that becomes critical at the range w away from the sampling point z. A coherent field of open asterisks is marked by cross hatching increasing from left to right.

X-symbols are used to indicate that a parameter set gives rise to a print that becomes critical at the range x away from the sampling point z. A coherent field of X-symbols is marked by cross hatching increasing from right to left.

Open squares are used to indicate that a parameter set gives rise to a print that becomes critical at the range y away from the sampling point z. A coherent field of open squares is marked by horizontal and vertical hatching.

Open diamonds are used to indicate that a parameter set gives rise to a print that is critical already at the sampling point z. A coherent field of open diamonds is marked by double cross hatching increasing from right to left.

By accessing a data representation of the diagram of FIG. 12, it is thus possible to ascertain whether a parameter set derived for a critical feature in a physical layout of an integrated circuit will be printed correctly or not throughout the process window. If correct printing is given throughout the process window, modifications to the layout can be performed. One solution to correct the detected errors is to apply a different OPC model with a different optical model and/or a different resist model, which can include a dose variation, to the detected patterns. The choice of this new OPC model is done regarding to the type of failure identified (example: necking, bridging) and the position in the process window, where it occurs. Then, iterations of OPC are done to move the detected edges and thus improve pattern printability, see an example of a corrected error in FIG. 13. The detection can be applied again on the resulting patterns to check if the correction removed all the errors.

Figure 13:
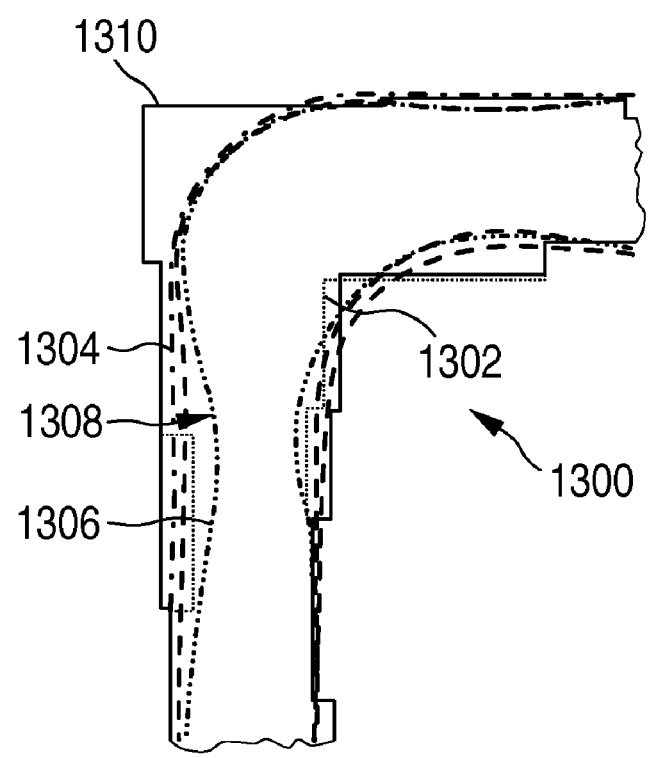
FIG. 13 shows a feature of an integrated circuit at different stages of a process flow, also indicating printing contours obtainable from the different physical layouts designed using a calibrated critical-failure model.

FIG. 13 shows a print feature 1300 forming a part of an integrated circuit, at different stages of a design process flow, using a calibrated critical-failure model and calculated using print simulations, including a OPC process flow. FIG. 13 also indicates printing contours obtainable from the different physical layouts of the print feature 1300. Such contours can for instance be obtained using a known computer program Solid-C.

The print feature 1300 represents a corner piece in the shape of the Greek capital letter Gamma (Γ) of a polysilicon line to be printed on a substrate. It will also be referred to as the corner piece 1300 in the following. Two layout-design stages are shown together with respective print contours obtained by print simulations. A layout shape of the corner piece as originally designed on mask level is shown by a dotted outline ( . . . . ) 1302. A first simulated print contour 1304 of the original shape of the corner piece at nominal process conditions is shown by a dash-dotted line (_._). A second simulated print contour of the original shape of the corner piece 1300 at process conditions characterized by a defocus of +125 nm and an increase of the exposure dose of +2% in comparison with the nominal process conditions is shown under reference label 1306 by a dash-dotted line with three dots between two respective dash elements (_...._). The simulated printing contour 1306 shows a print failure 1308 in the form of an onset of pinching (also called necking) off nominal process conditions at approximately the middle of the longitudinal extension of the vertical bar of the Gamma-shape. A print-failure criterion requires a line width above that of the simulated print contour at the occurrence position of the print failure 1308 for correct printing. The layout is therefore not stable in printing throughout the process window. Process variations off the nominal process conditions would not render a correct pattern. A corrected layout taking into account this critical feature is shown under reference label 1310 with a bold solid line. Segments of the corner piece 1300, in which the original layout 1302 and the corrected layout 1310 are identical, are shown by only the bold solid line. The corrected layout 1310 has additional width in the range of the print failure 1308. A print simulation of the corrected corner piece 1300 that has the nominal outline 1310 at the process conditions characterized by a defocus of +125 nm and an increase of the exposure dose of +2% shows an improved printed shape 1310, indicated by a dashed line. The width of the vertical section of the corner piece 1300 does not decrease and is mostly constant throughout the vertical extension.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. This invention can be applied on any design level, the failure detection needs only one simulation at a single process condition for characterizing the printing behavior throughout the process window, and the detection and correction can be fully implemented in a current OPC flow. This invention extends to applications like the detection of a missing assist feature or the detection of an disadvantageous printing assist feature. In the first case, the detection will be followed be the generation of a new assist feature. In the second case, the detection will be followed by the displacement of the printing feature or the removal of it.

In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. A method for calibrating a critical-failure model regarding a printing failure of a critical feature in a physical layout of a print pattern of an integrated circuit on a wafer substrate, comprising:
    providing a print-failure criterion for the critical feature of the print pattern of the integrated circuit, the print-failure criterion being related to a geometrical parameter in a print of the critical feature, as derived from test-print-simulation data simulating the print;
    providing test-print-simulation data by computer representing print simulations of different test patterns, which have the critical feature of the print pattern of the integrated circuit, wherein the different test patterns differ between each other in their respective values of the geometrical parameter of the critical feature;
    ascertaining a predefined optical-parameter set from the test-print-simulation data at the print position of the critical feature;
    scanning the test-print-simulation data for the presence of print-failures according to the print-failure criterion; and
    classifying regions in an optical-parameter space spanned by at least one optical parameter of the optical-parameter set according to at least two print-criticality levels using the detected print failures in the test-print simulations at respective points of the optical-parameter space;
wherein
    the predefined optical-parameter set is ascertained from the test-print-simulation data at only one sampling point of a process window, which sampling point is identical for all test patterns;
    at least one failure rule is provided before the classifying of the optical-parameter space, which failure rule provides trend information for points in the optical-parameter space, the trend information being indicative of a trend of the geometrical parameter in a print of the critical feature of a test pattern when moving from said sampling point in the process window to a different process-window point; and wherein classifying regions in the optical-parameter space comprises ascertaining the respective print-criticality levels from the test-print-simulation data at the sampling point and from the failure rule.

2. The method of claim 1, wherein classifying the optical-parameter space comprises, after scanning the test-print-simulation data for the presence of print-failures,
ascertaining a criticality-indicator value, which is indicative of a respective degree of criticality of a print of the critical feature according to the print-failure criterion,
wherein the criticality-indicator value depends on a detected presence or absence of a print-failure at the sampling point of the process window and on the trend of the geometrical parameter of the test pattern predicted by the failure rule when moving to at least one different process window point.

3. The method of claim 2, wherein classifying the optical-parameter space includes differentiating regions in the optical-parameter space according to different criticality-indicator values.

4. The method of claim 1, wherein the trend information provided by the failure rule is indicative of a change amount and change direction of the geometrical parameter in a print of the critical feature of the test pattern when moving from said sampling point in the process window to a different process-window point.

5. The method of claim 4, wherein the classifying of the optical-parameter space comprises ascertaining, from the test-print-simulation data at the sampling point and from the failure rule, for a given point in the optical-parameter space, a point in the process window, at which the respective criticality-indicator value exceeds a predetermined threshold.

6. The method of claim 5, wherein classifying the optical-parameter space comprises
ascertaining, for a respective point in the optical-parameter space, a distance between the sample point of the process window and a nearest process-window point, at which the respective criticality-indicator value exceeds a predetermined threshold.

7. The method of claim 1, wherein the optical-parameter set comprises at least one optical parameter from a parameter group formed by
a) a maximum intensity of an aerial image of the test pattern at the print position of the feature,
b) a minimum intensity of an aerial image of the test pattern at the print position of the feature,
c) a slope of an intensity profile of an aerial image of the test pattern at the print position of the feature at a predefined threshold position between the positions of the minimum intensity and of the maximum intensity in the aerial image of the test pattern, and
d) a composite optical parameter formed by an algebraic combination at least two of the optical parameters recited in a) through c).

8. The method of claim 1, wherein the process window is spanned by an exposure-radiation-dose interval available for exposing a resist layer at a print position of the critical feature and by an available focus-position interval of a mask-image plane relative to the resist layer at the position of the critical feature.

9. A method for correcting a critical feature in a physical layout of a print pattern in an integrated circuit on a wafer substrate, comprising
providing a calibrated critical-failure model regarding a printing failure of a critical feature according to the method of claim 1;
providing physical-layout data representing the physical layout of the integrated circuit on the wafer substrate;
detecting, using the physical-layout data, an occurrence position of the critical feature in the physical layout of the integrated circuit;
performing a print simulation by computer of the physical layout at the occurrence position of the critical feature;
extracting at least one optical parameter of the critical feature, which optical parameter corresponds to the optical-parameter set used in the critical-failure model, from the print simulation at the occurrence position of the critical feature;
ascertaining a print-criticality level of the critical feature at the occurrence position from the critical-failure model;
changing a geometrical parameter of the critical feature in the physical layout at the occurrence position if the critical feature has an ascertained print-criticality level above a predefined threshold value.

10. A method for designing a physical layout of an integrated circuit, including a method for calibrating a critical-failure model regarding a printing failure of a critical feature in the physical layout of a print pattern of the integrated circuit, the method comprising:
providing a print-failure criterion for the critical feature in the physical layout of the print pattern of the integrated circuit, the print-failure criterion being related to a geometrical parameter in a print of the critical feature, as derived from test-print-simulation data simulating the print;
providing test-print-simulation data by computer representing print simulations of different test patterns, which have the critical feature, wherein the different test patterns differ between each other in their respective values of the geometrical parameter of the critical feature;
ascertaining a predefined optical-parameter set from the test-print-simulation data at the print position of the critical feature;
scanning the test-print-simulation data for the presence of print-failures according to the print-failure criterion; and
classifying regions in an optical-parameter space spanned by at least one optical parameter of the optical-parameter set according to at least two print-criticality levels using the detected print failures in the test-print simulations at respective points of the optical-parameter space; wherein
the predefined optical-parameter set is ascertained from the test-print-simulation data at only one sampling point of a process window, which sampling point is identical for all test patterns;
at least one failure rule is provided before the classifying of the optical-parameter space, which failure rule provides trend information for points in the optical-parameter space, the trend information being indicative of a trend of the geometrical parameter in a print of the critical feature of a test pattern when moving from said sampling point in the process window to a different process-window point; and wherein
classifying regions in the optical-parameter space comprises ascertaining the respective print-criticality levels from the test-print-simulation data at the sampling point and from the failure rule.

11. A method for designing a physical layout of an integrated circuit, comprising:
calibrating a critical-failure model regarding a printing failure of a critical feature in a physical layout of a print pattern, wherein calibrating the critical-failure model includes, providing a print-failure criterion for the critical feature, the print-failure criterion being related to a geometrical parameter in a print of the critical feature, as derived from test-print-simulation data simulating the print;

providing test-print-simulation data by computer representing print simulations of different test patterns, which have the critical feature, wherein the different test patterns differ between each other in their respective values of the geometrical parameter of the critical feature;

ascertaining a predefined optical-parameter set from the test-print-simulation data at the print position of the critical feature;

scanning the test-print-simulation data for the presence of print-failures according to the print-failure criterion; and classifying regions in an optical-parameter space spanned by at least one optical parameter of the optical-parameter set according to at least two print-criticality levels using the detected print failures in the test-print simulations at respective points of the optical-parameter space; wherein the predefined optical-parameter set is ascertained from the test-print-simulation data at only one sampling point of a process window, which sampling point is identical for all test patterns;

at least one failure rule is provided before the classifying of the optical-parameter space, which failure rule provides trend information for points in the optical-parameter space, the trend information being indicative of a trend of the geometrical parameter in a print of the critical feature of a test pattern when moving from said sampling point in the process window to a different process-window point; and wherein classifying regions in the optical-parameter space comprises ascertaining the respective print-criticality levels from the test-print-simulation data at the sampling point and from the failure rule; and correcting a critical feature in a physical layout of a print pattern, wherein correcting the critical feature includes, providing a calibrated critical-failure model regarding a printing failure of a critical feature according to the method of claim 1;

providing physical-layout data representing the physical layout of the integrated circuit;

detecting, using the physical-layout data, an occurrence position (1308) of the critical feature in the physical layout;

performing a print simulation of the physical layout at the occurrence position of the critical feature;

extracting at least one optical parameter of the critical feature, which optical parameter corresponds to the optical-parameter set used in the critical-failure model, from the print simulation at the occurrence position of the critical feature;

ascertaining a print-criticality level of the critical feature at the occurrence position from the critical-failure model;

changing a geometrical parameter of the critical feature in the physical layout at the occurrence position if the critical feature has an ascertained print-criticality level above a predefined threshold value.

12. An apparatus for calibrating a critical-failure model regarding a printing failure of a critical feature in a physical layout of a print pattern, comprising a) a test-print-evaluation unit that has an input for receiving test-print-simulation data representing print simulations of different test patterns calculated for only one sampling point of a process window, which sampling point is identical for all test patterns having the critical feature, the test-print evaluation unit being configured to ascertain a predefined optical-parameter set from the test-print-simulation data at a print position of the critical feature and to provide at its output the ascertained set of optical parameters;

b) a print-failure detection unit that is configured to scan the test-print-simulation data for the presence of print-failures according to a print-failure criterion, the print-failure criterion being related to a geometrical parameter of the critical feature in a print of the critical feature, as derived from the test-print simulation data;

c) a model-calibration unit, which is configured to classify regions in an optical-parameter space spanned by at least one optical parameter of the optical-parameter set according to at least two print-criticality levels and to provide at its output a print model comprising allocations of respective criticality levels of respective points in the optical-parameter space;

d) wherein the model-calibration unit comprises a failure-rule unit, which is configured to apply a failure rule providing trend information for a given point in the optical-parameter space, the trend information being indicative of a trend of the geometrical parameter in a print of the critical feature of a test pattern when moving from said sampling point in the process window to a different process-window point, to a given point in the optical-parameter space and to provide the trend information at its output; and e) wherein the model-calibration unit is configured to ascertain the respective print-criticality levels from the test-print-simulation data at respective points of the optical-parameter space, at the sampling point and at least one different process-window point using the failure rule.

13. The apparatus of claim 12, comprising a test-print simulator unit, which is configured to calculate test-print-simulation data representing print simulations of different test patterns, which have the critical feature, wherein the different test patterns differ between each other in their respective values of a geometrical parameter of the critical feature, for only one sampling point of a process window, which sampling point is identical for all test patterns; and to provide at its output test-print-simulation data representing the test print simulations.

14. The apparatus of claim 12, wherein the model-calibration unit is configured to ascertain a criticality-indicator value, which is indicative of a respective degree of criticality of a print of the critical feature according to the print-failure criterion, wherein the criticality indicator value depends on a detected presence or absence of a print-failure at the sampling point of the process window and on the trend of the geometrical parameter of the test pattern predicted by the failure rule when moving to at least one different process window point.

15. The apparatus of claim 14, wherein the failure-rule unit is configured to provide trend information, which is indicative of a change amount and change direction of the geometrical parameter in a print of the critical feature of a test pattern when moving from said sampling point in the process window to a selectable different process-window point.

16. The apparatus of 15, wherein the model-calibration unit is configured to ascertain, from the test-print-simulation data at the sampling point and from the failure rule, for a given point in the optical-parameter space, a point in the process window, at which the respective criticality-indicator value exceeds a predetermined threshold.

17. The apparatus of claim 16, wherein the model-calibration unit is configured to ascertain, for a respective point in the optical-parameter space, a distance between the sample point of the process window and a nearest process-window point, for which a print failure of the critical feature is predicted according to the failure rule.

18. An apparatus for correcting a critical feature in a physical layout of a print pattern, comprising an apparatus for calibrating a critical-failure model regarding a printing failure of a critical feature in a physical layout of a print pattern calibrating a critical-failure model regarding a printing failure of a critical feature according to claim 12;

a layout input for receiving physical-layout data representing the physical layout of the print pattern;

a layout-scanner unit, which is configured to detect, using the physical-layout data, an occurrence position of the critical feature in the physical layout;

a print-simulator unit, which is configured to calculate print-simulation data representing a print simulation of a region of print pattern, which comprises the detected occurrence position of the critical feature, and to provide at its output print-simulation data representing the print simulation;

an optical-parameter extraction unit, which is configured to extract at least one optical parameter of the critical feature, which optical parameter corresponds to the optical-parameter set used in the critical-failure model, from the print simulation at the occurrence position of the critical feature;

a classification unit, which is configured to ascertain a print-criticality level of the critical feature at the occurrence position from the critical-failure model;

a correction unit, which is configured to change a geometrical parameter of the critical feature in the physical layout at the occurrence position if the critical feature has an ascertained print-criticality level above a predefined threshold value.

19. An apparatus for designing a physical layout of an integrated circuit, comprising an apparatus for calibrating a critical-failure model regarding a printing failure of a critical feature in a physical layout of a print pattern according to claim 12.

* * * * *